US007113446B2

(12) United States Patent
Fujisawa

(10) Patent No.: US 7,113,446 B2
(45) Date of Patent: Sep. 26, 2006

(54) LATCH CIRCUIT AND SYNCHRONOUS MEMORY INCLUDING THE SAME

(75) Inventor: Hiroki Fujisawa, Tokyo (JP)

(73) Assignee: Elpida Memory Inc., Tokyo (JP)

( * ) Notice: Subject to any disclaimer, the term of this patent is extended or adjusted under 35 U.S.C. 154(b) by 0 days.

(21) Appl. No.: 10/995,528

(22) Filed: Nov. 24, 2004

(65) Prior Publication Data

US 2005/0141333 A1 Jun. 30, 2005

(30) Foreign Application Priority Data

Nov. 25, 2003 (JP) .............................. 2003-393386

(51) Int. Cl.
*G11C 8/00* (2006.01)

(52) U.S. Cl. ...................................... 365/233; 365/191

(58) Field of Classification Search ................ 365/233, 365/191
See application file for complete search history.

(56) References Cited

U.S. PATENT DOCUMENTS

| 6,680,866 B1 * | 1/2004 | Kajimoto ................ 365/189.01 |
| 6,680,875 B1 * | 1/2004 | Horiguchi et al. ............ 365/233 |
| 6,774,674 B1 * | 8/2004 | Okamoto et al. .............. 326/80 |

* cited by examiner

*Primary Examiner*—Michael T. Tran
(74) *Attorney, Agent, or Firm*—Foley & Lardner LLP

(57) ABSTRACT

A latch system has two latch circuits corresponding to two internal clock signals synchronized with an external output signal. The internal clock signals are synchronized with rising edges of the external clock signal and produced as one-shot pulses having a frequency corresponding to ½ of an external clock frequency of the external clock signal.

18 Claims, 14 Drawing Sheets

LATCH CIRCUIT AND SYNCHRONOUS MEMORY INCLUDING THE SAME

This application claims priority to prior Japanese application JP 2003-393386, the disclosure of which is incorporated herein by reference.

BACKGROUND OF THE INVENTION

This invention relates to a latch circuit for use in a synchronous memory which has an internal clock circuit for producing an internal clock signal for latching an address signal, a command signal, and a data signal in synchronization with an external clock signal and which inputs and outputs the address signal, the command signal, and the data signal in accordance with the internal clock signal. This invention also relates to the synchronous memory including the latch circuit.

For a latch circuit used in an existing synchronous memory such as a synchronous dynamic random access memory (SDRAM), a setup time and a hold time of an input signal, input and output pin capacitances, and input and output amplitudes are defined in detail in specifications so as to operate an input/output interface between an inside and an outside of a chip at a high frequency (i.e., a high speed). On the other hand, in order to increase an operation speed inside the chip, development of a finer process and a higher-speed device is effective, but it is difficult to follow up the high-frequency (high-speed) operation of the interface. Thus, a difference between the operation speed inside the chip and the operation speed at the interface tends to increase. Under the circumstances, a prefetch memory capable of reading and writing a plurality of bits of data in parallel is effective in order to increase the operation speed inside the chip.

As a typical prefetch memory, a double data rate synchronous dynamic random access memory (DDR-SDRAM) is known. The DDR-SDRAM transfers a data at a rising edge and a falling edge of an external clock, i.e., at a double data rate as compared with a synchronous operation in which a single data is transferred in one cycle of the external clock. In the DDR-SDRAM, the number of prefetch bits is equal to 2N where N represents the number of data pins (DQ). Thus, 2N-prefetch is achieved. Further, in a DDR2-SDRAM as an improvement of the DDR-SDRAM, data transfer is continuously carried out every two cycles of the external clock. In this case, the number of prefetch bits is equal to 4N. Thus, 4N-prefetch is achieved. By increasing the number of the prefetch bits as mentioned above, a data transfer rate is improved. In case of a 8-bit (×8) structure, N is equal to 8.

In the 2N-prefetch, 2×8 (=16) bits of data are read in parallel and outputted at two separate timings, i.e., in synchronization with the rising edge and the falling edge in each cycle of the external clock. Therefore, the 2N-prefetch allows an operating frequency inside the chip to be equal to ½ of an external clock frequency of the external clock. In the 4N-prefetch, 4×8 (=32) bits of data are read in parallel and outputted at four separate timings, i.e., in synchronization with the rising edges and the falling edges in every two cycles of the external clock. Therefore, the 4N-prefetch allows the operating frequency inside the chip to be equal to ¼. Thus, such a prefetch architecture is effective in increasing the operation speed inside the chip in conformity with the higher-frequency operation of the interface.

However, even if the prefetch architecture is used, it is impossible to increase an operation speed at a portion where an external input signal such as a command signal, an address signal, or a data signal is captured from the outside of the chip to the inside of the chip. The above-mentioned portion is implemented by a latch circuit and must have a clock frequency equal to the external clock frequency in order to enable the address signal, the command signal, or the data signal to be inputted and outputted in synchronization with the external clock. Therefore, an operating frequency of the synchronous memory is limited by a performance of the latch circuit even if the prefetch architecture is adopted.

Recently, the higher-frequency operation at the interface is achieved by lowering a power supply voltage from 2.5 V to 1.8V, further to 1.5 V, and narrowing an amplitude of the external input signal. Correspondingly, the operation speed inside the chip is increased by increasing the number of prefetch bits from 2N to 4N, further to 8N. Under the circumstances, the latch circuit is also required to be increased in operation speed in order to meet the higher-frequency operation at the interface.

Referring to FIGS. 1 through 3, an existing DDR2-SDRAM will be described. A command latch circuit 130 illustrated in FIGS. 1 and 2 comprises a command decoder 131, a latch circuit 132, and an output circuit 132. Various external command signals RASB, CASB, WEB, and CSB are captured into an internal circuit of the chip through the command decoder 131, the latch circuit 132, and the output circuit 133. The latch circuit 132 is supplied with an internal clock signal CLKB as a control signal for latching.

As shown in FIG. 3, the internal clock signal CLKB synchronized with all rising edges of an external clock signal CK is supplied to the latch circuit 132. Therefore, the external clock signal CK and the internal clock signal CLKB are equal in operating frequency to each other. Thus, the command latch circuit 130 comprises a latch circuit 132 corresponding to the internal clock signal CLKB and is operable at the operating frequency equal to an external clock frequency of the external clock signal CK.

For a standard data transfer rate of 667 Mbps of the DDR2-SDRAM, the external clock signal CK has a frequency period (TCK) of 3 ns. In this case, the internal clock signal CLKB has a pulse width as small as about 1.5 ns which corresponds to a half of that in the DDR-SDRAM having a data transfer rate of 333 Mbps. Therefore, without a significant improvement such as achievement of a finer process and a higher-speed device, it is difficult to reserve a sufficient margin in capturing or fetching the command signal. In this event, an operation error may be caused to occur due to an insufficient margin.

As a result, the operating frequency inside the chip is limited by the performance of the latch circuit. Even in the prefetch architecture is adopted, a high-frequency memory is difficult to achieve. Further, a high-frequency operation inside the latch circuit deteriorates setup and hold characteristics.

SUMMARY OF THE INVENTION

It is therefore an object of this invention to provide a latch system capable of increasing a latch margin upon a high-frequency operation to thereby improve setup and hold characteristics and prevent an operation error.

It is another object of this invention to provide a synchronous memory including the above-mentioned latch system.

It is a specific object of this invention to provide a latch circuit adapted to a high-frequency operation.

According to this invention, there is provided a latch system which is for latching a command signal, an address signal, or a data signal as an external input signal supplied from an outside in synchronization with an external clock signal and which comprises an internal clock generating circuit for generating two internal clock signals as one-shot pulses in synchronization with the external clock signal, and a pair of latch circuits for latching the command signal, the address signal, or the data signal by the internal clock signals.

In order to provide a latch circuit used in a synchronous memory to latch a command signal, an address signal, and a data signal and adapted to a high-frequency operation, a latch system according to this invention has a structure such that two internal clock signals are produced in response to an external clock signal and supplied to two latch circuits for latching the command signal, the address signal, and the data signal. With this structure, an internal clock frequency can be lowered to ½ of an external clock frequency. It is therefore possible to increase a pulse width of the internal clock signal and to increase a latch margin upon a high-frequency operation.

Thus, at a data transfer rate 667 Mbps of the DDR2-SDRAM, the pulse width of the internal clock signal can be increased from 1.5 ns in the existing synchronous memory to about 2.8 ns.

Since the operating frequency of the latch circuit can be lowered to ½ as compared with the existing synchronous memory, it is possible to reserve a sufficient operating margin at an internal node inside the latch circuit and to improve setup and hold characteristics affected by the operating margin.

The internal clock generating circuit produces the internal clock signals as one-shot pulses. Therefore, even if supply of the external clock signal is stopped, for example, in a self-refresh mode, the internal clock signals are reset so that an operation error is avoided.

DESCRIPTION OF THE PREFERRED EMBODIMENTS

Figure 1:
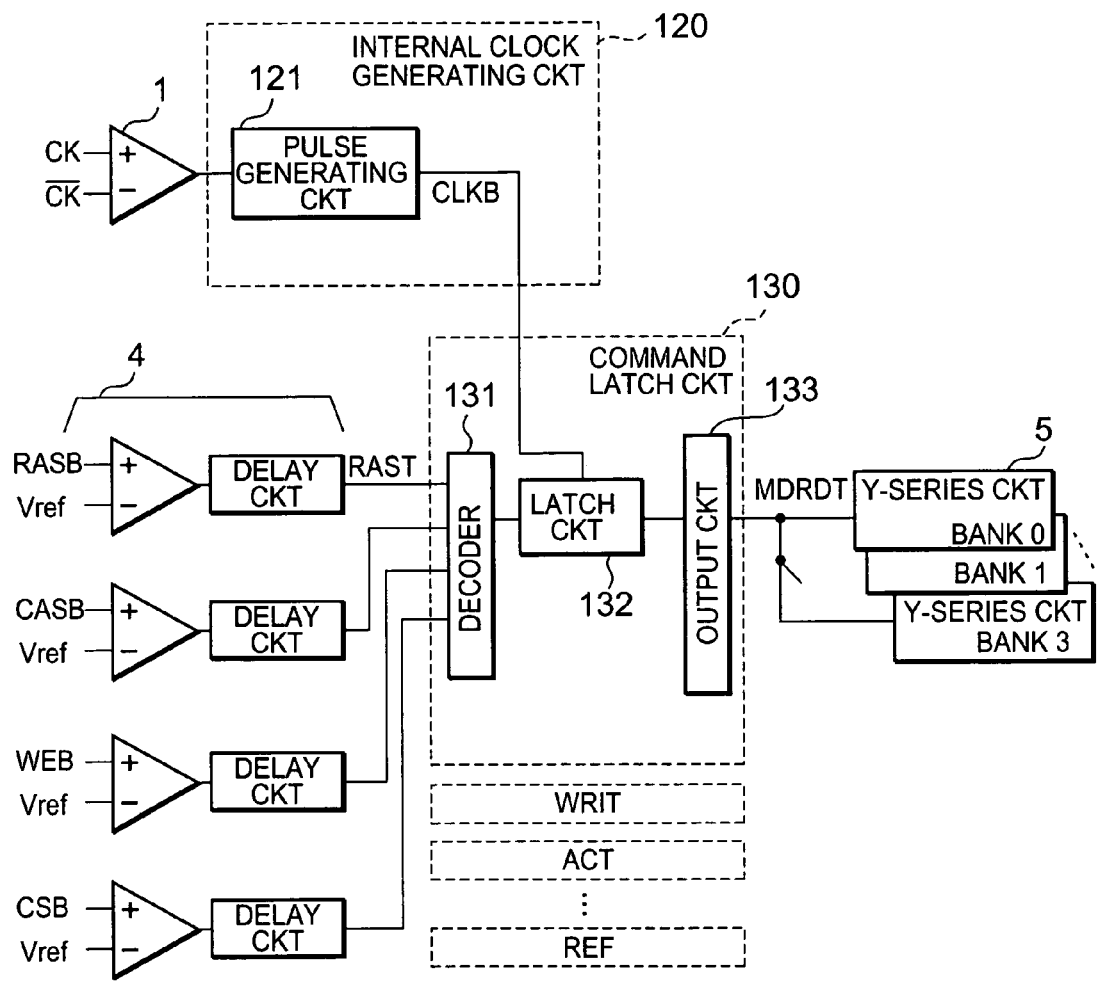
FIG. 1 is a functional block diagram of an existing synchronous memory having a command latch circuit.

Now, description will be made of several preferred embodiments of this invention with reference to the drawing.

First Embodiment

Referring to FIGS. 4 through 7, description will be made of a synchronous memory having a read command latch circuit according to a first embodiment of this invention. In the following, only a part of the synchronous memory which is related to this invention will be described and description of the remaining part will be omitted.

Figure 4:
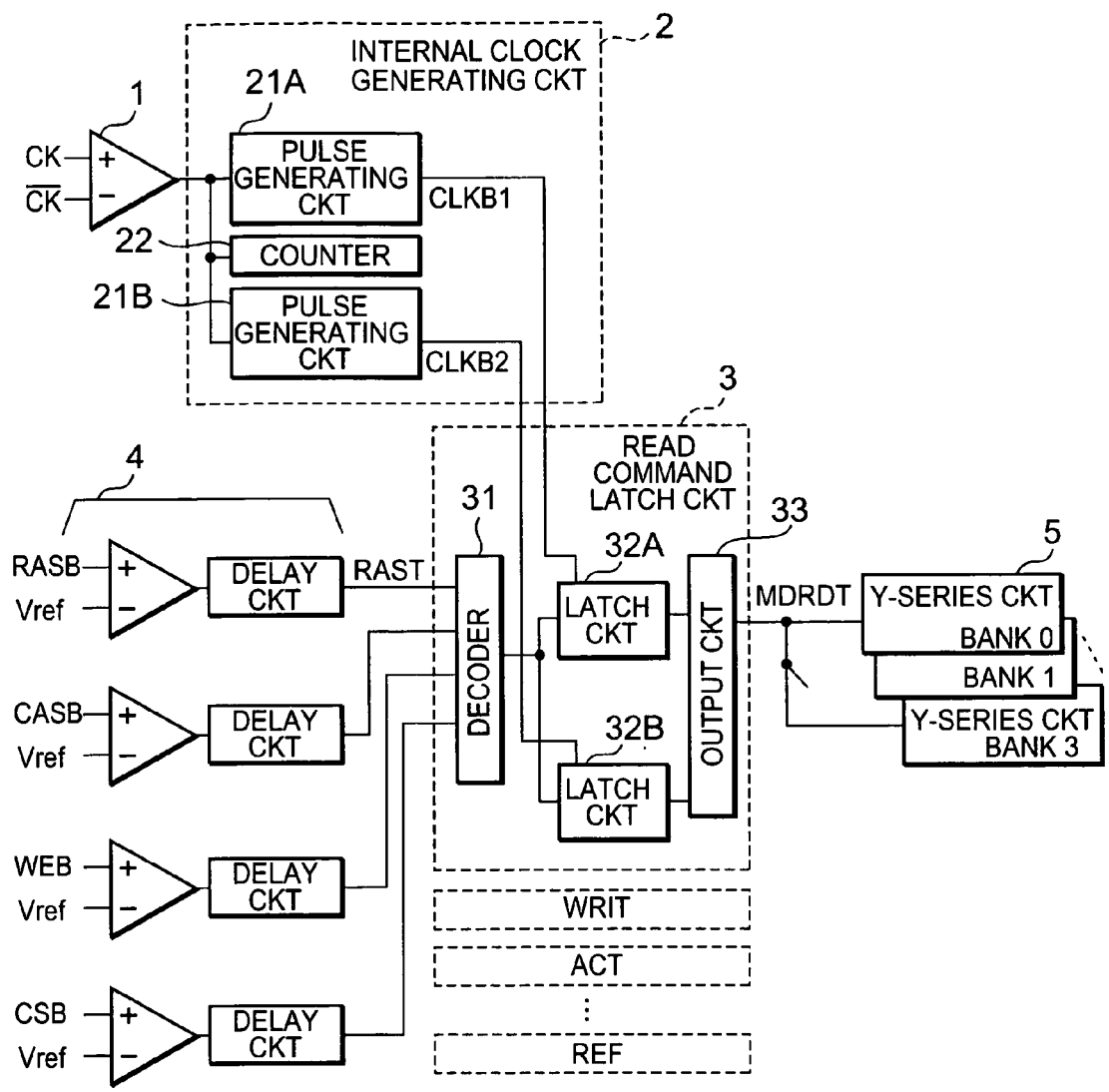
FIG. 4 is a functional block diagram of a synchronous memory having a read command latch circuit according to a first embodiment of this invention.

Referring to FIG. 4, the synchronous memory comprises an external clock input circuit 1, an internal clock generating circuit 2, a read command latch circuit 3, an external signal input circuit 4, and a Y-series circuit 5.

The synchronous memory according to this invention is characterized by a 4N-prefetch operation. The internal clock generating circuit 2 produces two internal clock signals CLKB1 and CLKB2. The read command latch circuit 3 receives the internal clock signals CLKB1 and CLKB2 at a pair of latch circuits 32A and 32B.

The external clock input circuit 1 is an arithmetic amplifier supplied with external clock signals CK and $\overline{CK}$, and sends an amplified output to the internal clock generating circuit 2. The internal clock generating circuit 2 comprises a pair of pulse generating circuits 21A and 21B and a counter 22. The pulse generating circuits 21A and 21B produce two one-shot pulses as the internal clock signals CLKB1 and CLKB2 and deliver the internal clock signals CLKB1 and CLKB2 to the read command latch circuit 3. The read command latch circuit 3 comprises a command decoder 31, the latch circuits 32A and 32B, and an output circuit 33. The latch circuits 32A and 32B receive a command signal from the external signal input circuit 4 through the decoder 31. The latch circuits 32A and 32B latch the command signal by the internal clock signals CLKB1 and CLKB2, respectively, and deliver the command signal through the output circuit 33 to the Y-series circuit 5 in a memory block.

Figure 5:
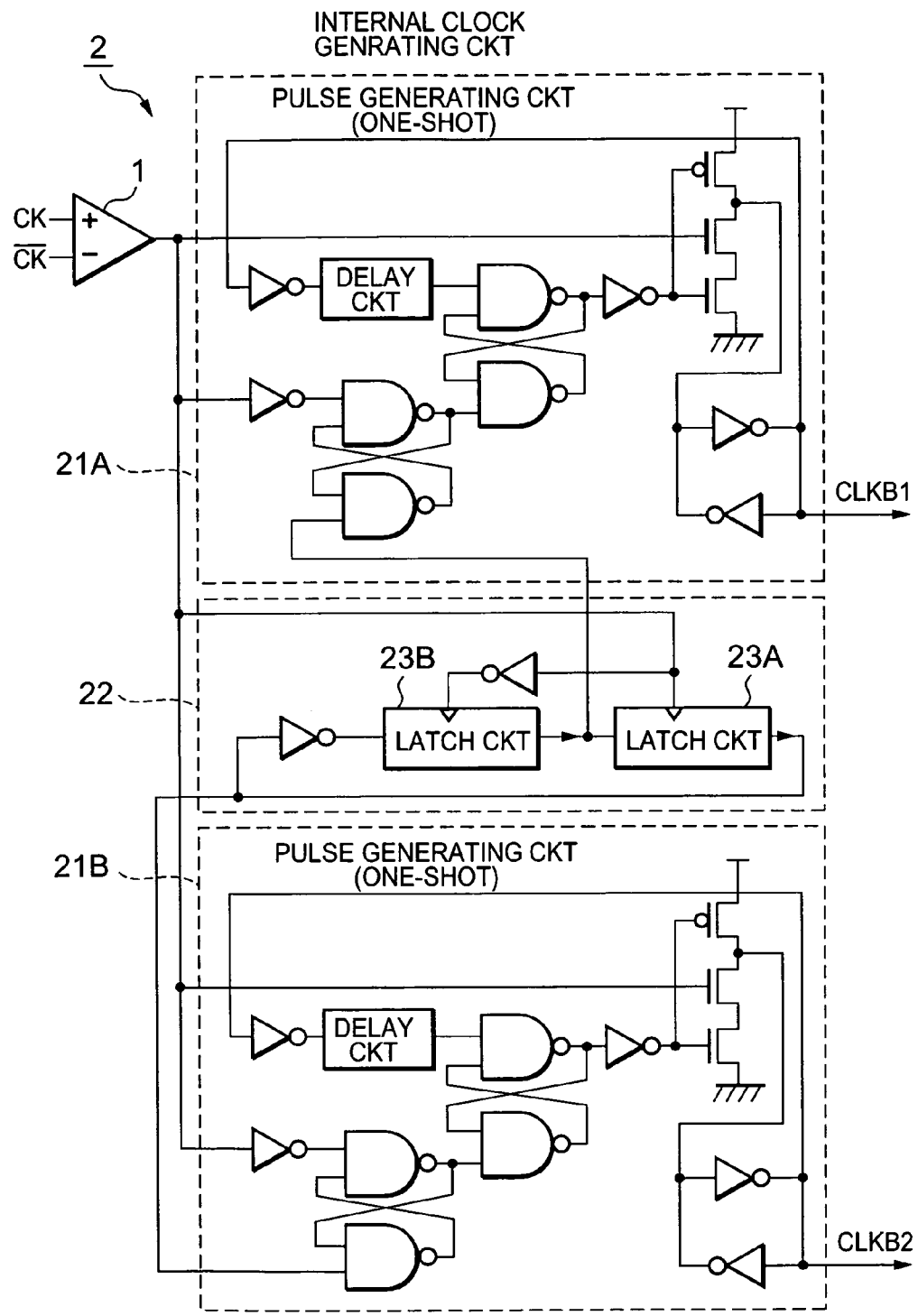
FIG. 5 is a circuit block diagram of an internal clock generating circuit illustrated in FIG. 4.

Referring to FIG. 5, the internal clock generating circuit 2 will be described in detail. As illustrated in the figure, each of the pulse generating circuits 21A and 21B comprises two input-side inverters, an output-side inverter, a delay circuit, two NAND latch circuits, and an output circuit. The output circuit comprises first through third transistors connected in series between a power source and a ground level, and two inverters forming a flip-flop which has an input terminal connected to a connection point of the first and the second transistors and which produces the internal clock signal CLKB1 or CLKB2.

One of the input-side inverters is supplied with the output of the external clock input circuit 1. The other input-side inverter is supplied with an output of the pulse generating circuit 21A or 21B. One of the NAND latch circuit is supplied with an output of the one input-side inverter and an output of the counter 22. The counter 22 produces two signals, i.e., a non-inverted and an inverted signal to be supplied to the pulse generating circuits 21A and 21B, as will later be described in conjunction with the counter 22. The other NAND latch circuit is supplied with an output of the other input-side inverter through the delay circuit and an output of the one NAND latch circuit. The other NAND latch circuit produces an output which is inverted by the output-side inverter and supplied to a gate of the first transistor and a gate of the third transistor. A gate of the second transistor is supplied with the output of the external clock input circuit 1.

By delaying the output signal by a delay circuit, one-shot pulses having a pulse width equal to a delay time are produced. With this structure, the internal clock signals as one-shot pulses having a frequency corresponding to ½ of the external clock signal are obtained.

As illustrated in FIG. 5, the counter 22 has two latch circuits 23A and 23B and two inverters. The latch circuit 23A is supplied with the output of the external clock input circuit 1 and an output of the latch circuit 23B and produces an output which is supplied through one of the inverters to the latch circuit 23B and to the pulse generating circuit 21B. The latch circuit 23B is supplied with the output of the external clock input circuit 1 through the other inverter and produces the output which is supplied to the latch circuit 23A and the pulse generating circuit 21A.

Thus, the internal clock generating circuit 2 has a pair of one-shot pulse generating circuits (the pulse generating circuits 21A and 21B) and a clock counter circuit (the counter 22). Each of the one-shot pulse generating circuits produces a one-shot signal in synchronization with a rising edge of the external clock signal CK. The clock counter circuit produces the non-inverted and the inverted signals obtained by frequency-dividing the external clock signal and alternately activates one and the other one-shot pulse generating circuits. The internal clock generating circuit 2 produces the internal clock signals CLKB1 and CLKB2. Thus, one-shot pulses are alternately generated in synchronization with the rising edges of the external clock signal CK.

Figure 6:
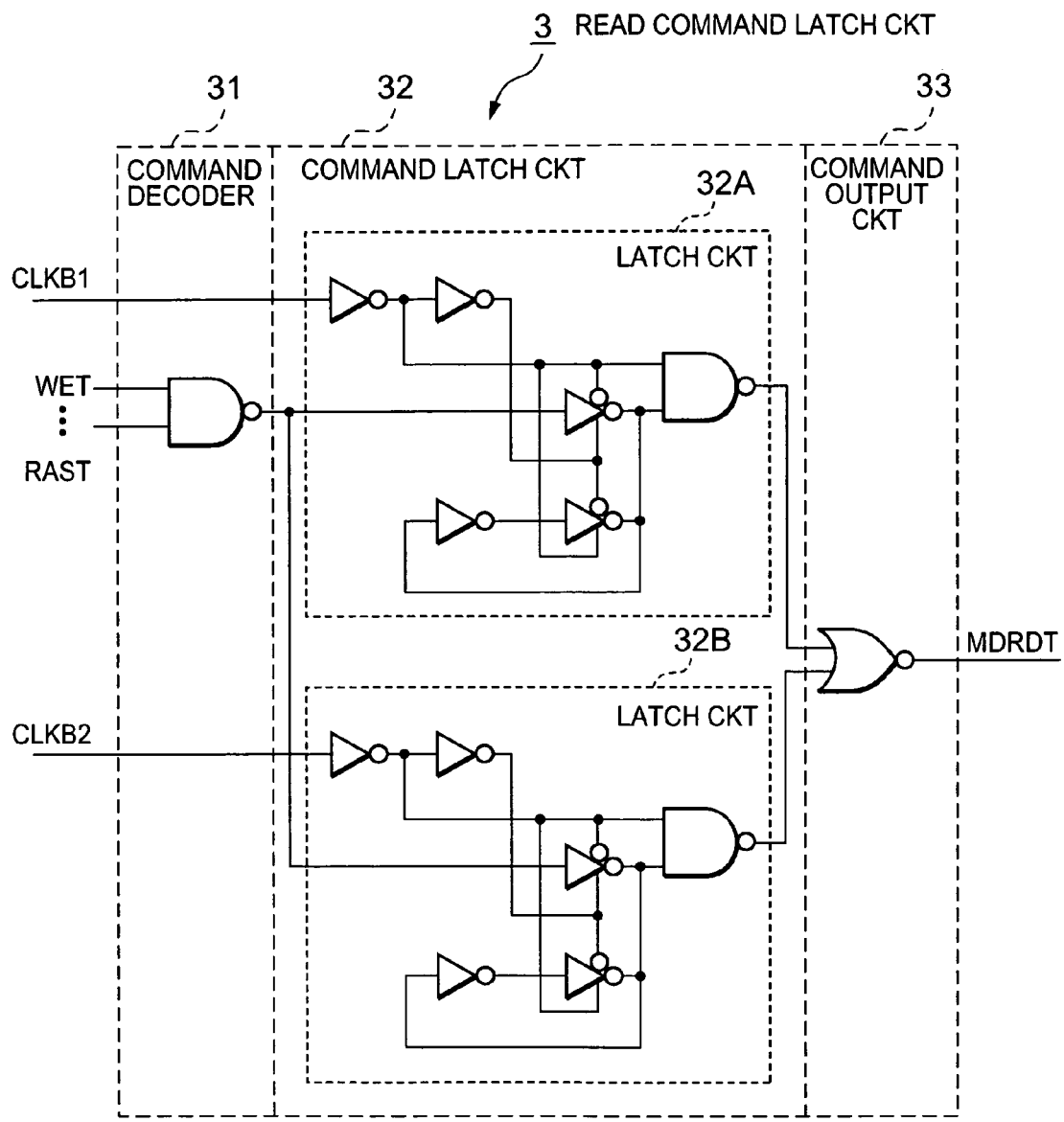
FIG. 6 is a circuit block diagram of a read command latch circuit illustrated in FIG. 4.

Next referring to FIG. 6, the read command latch circuit 3 comprises the decoder 3, the command latch circuit 32, and the output circuit 33.

Figure 2:
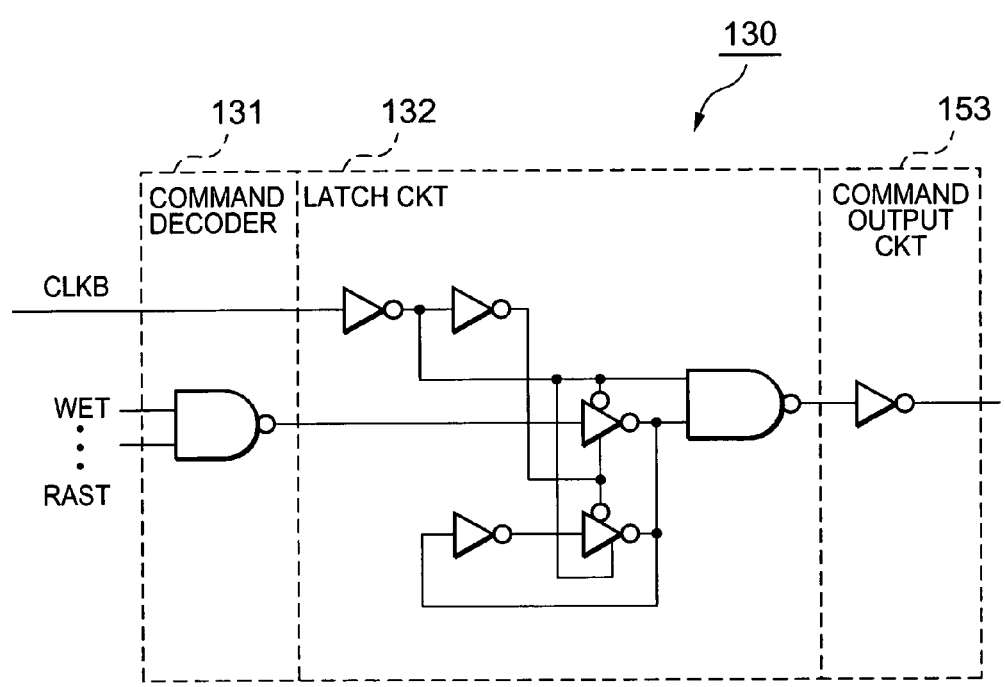
FIG. 2 is a circuit block diagram of the command latch circuit illustrated in FIG. 1.
Figure 3:
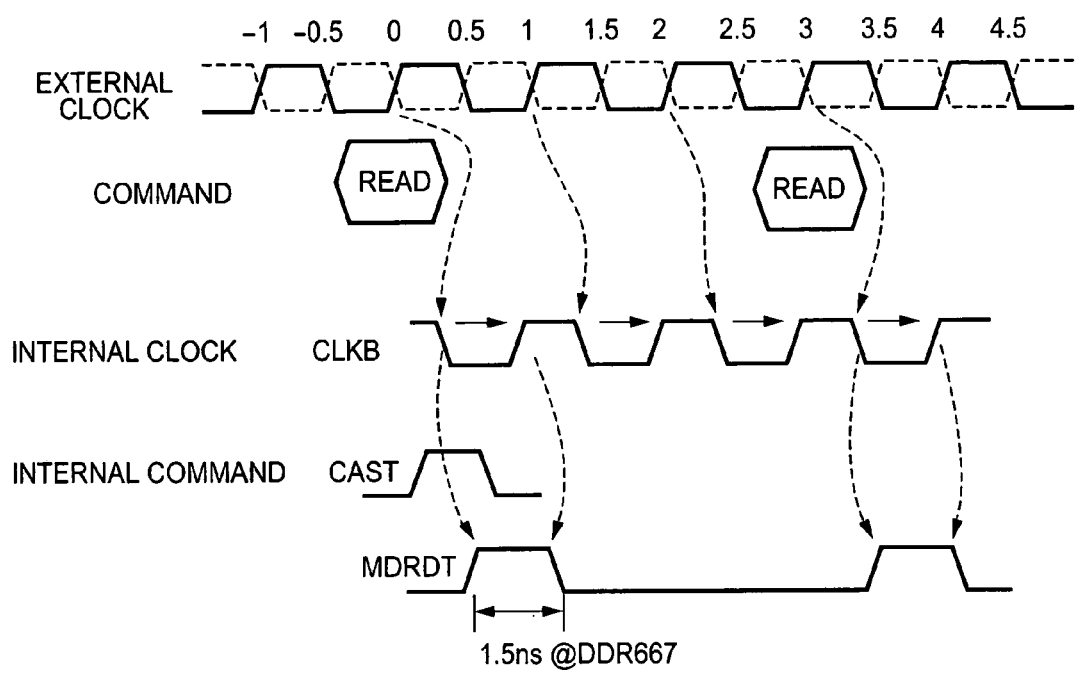
FIG. 3 is a time chart for describing an operation of the command latch circuit illustrated in FIG. 1.

The decoder 31 has a NAND gate which is supplied with the external signals from the external signal input circuit 4 (FIG. 4) for producing a decoded signal which is supplied to the command latch circuit 32. It is noted here that "RAST" in FIG. 6 is a Row Address Strobe True and represents that a high level is an active level. The command latch circuit 32 has the latch circuits 32A and 32B. The output circuit 33 has an OR gate responsive to outputs of the latch circuits 32A and 32B for producing an output signal MDRDT which is sent to the Y-series circuit 5 (FIG. 4). The latch circuits 32A and 32B are supplied with the first and the second internal clock signals CLKB1 and CLKB2 from the internal clock generating circuit 2, respectively, and successively produce the output signal MDRDT in correspondence to the internal clock signals CLKB1 and CLKB2. Each of the latch circuits 32A and 32B is identical with the latch circuit 132 in FIG. 2 and detailed description thereof will be omitted.

In the above-mentioned example, a read command latch system is shown. The output signal MDRDT is a read control command signal. The command decoder 31 comprises the NAND gate of an ordinary type and decodes each command signal by a combination of external command signals with reference to a specification table. The command latch circuit comprises a pair of latch circuits operated in synchronization with falling edges of the internal clock signals CLKB1 and CLKB2, respectively. Specifically, at the falling edge of the internal clock signal CLKB1, one of the latch circuits latches an input command signal. In case where the input command signal is a read command signal, the output signal MDRDT is produced. Next, at the falling edge of the internal clock signal CLKB2, the other latch circuit latches an input command signal. In case where the input command signal is the read command signal, the output signal MDRDT is produced. Herein, outputs of the latch circuits are subjected to an OR logic to produce the output signal. Specifically, in case where either one of the latch circuits latches the read command signal, the output signal MDRDT is produced.

As a characteristic of the 4N-prefetch, it is inhibited to input the same command signals in synchronization with consecutive rising edges of the clock signals. Specifically, if the read command signal is latched by the internal clock signal CLKB1, the read command signal is not consecutively latched by the internal clock signal CLKB2 next following the internal clock signal CLKB1. Therefore, each of the latch circuits is allowed to operate at a twice cycle of the external clock signal. In case where the external clock signal CK has a cycle of 3 ns and a data transfer rate is 667 Mbps, the latch circuit is operated at a cycle of 6 ns twice as large. Thus, the latch circuit is operated at a frequency corresponding to ½ of the external clock frequency of the external clock signal CK.

Figure 7:
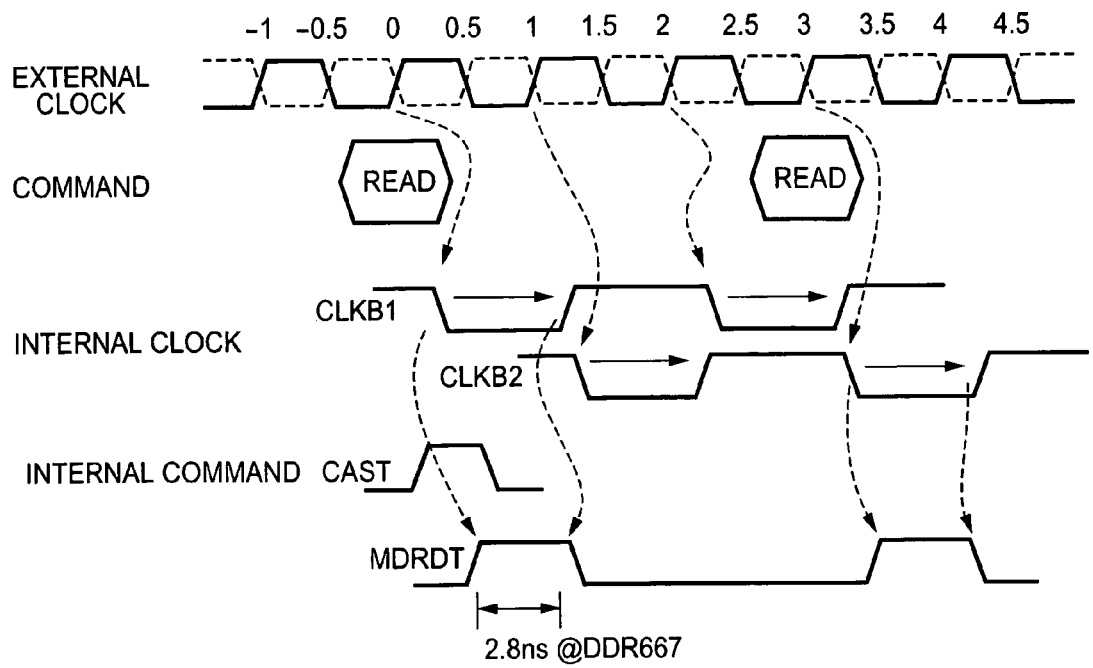
FIG. 7 is a time chart for describing an operation of the read command latch circuit illustrated in FIG. 6.

Referring to FIG. 7 in addition to FIGS. 4 through 6, a read operation will be described. It is assumed here that read command signals are inputted at a rising edge "0" and at a rising edge "3".

In the 4N-prefetch, it is defined in the specifications that the read command signals are to be supplied at an interval of 2 clocks or more. This is because a read operation inside the chip is executed in two clock periods. By the use of this technique, a 4N-prefetch memory achieves an improvement about twice in operating frequency as compared with a 2N-prefetch memory. Therefore, if a read command signal is inputted at the rising edge "0" of the external clock signal CK, a next read command is inputted at the rising edge "2" or at a later rising edge of the external clock signal CK. Herein, as the internal clock signal CLKB1, one-shot pulses are produced at even-numbered rising edges of the external clock signal CK.

On the other hand, as the internal clock signal CLKB2, one-shot pulses are produced at odd-numbered rising edges of the external clock signal CK. In this embodiment, the command signals are latched by the use of the internal clock signals CLKB1 and CLKB2. Therefore, the pulse width of each of the internal clock signals CLKB1 and CLKB2 can be widened to about 2.8 ns when the DDR2-SDRAM has a data transfer rate of 667 Mbps. Since the one-shot pulses are used, the command signals can be latched even if the operating frequency is low and the interval between the same commands is one clock.

Second Embodiment

As a second embodiment, description will be made of a case where the synchronous memory in the first embodiment is used in a self-refresh mode.

In the self-refresh mode, a latch circuit equivalent to the read command latch circuit in FIG. 4 is used as a self-refresh latch circuit. A circuit structure similar to that illustrated in FIGS. 5 and 6 is used without any change.

In the self-refresh mode, electric charges in a memory cell of the DRAM are held at a low electric power. The chip put into the self-refresh mode need not be supplied with an external signal. Inside the chip, a refresh operation is automatically carried out in a predetermined cycle to hold information in the memory cell. Therefore, it is general to stop supply of the external clock signal to the chip in the self-refresh mode. In the specifications, it is allowed to stop the external clock signal from a next cycle after a self-refresh command SELF is inputted.

Figure 8:
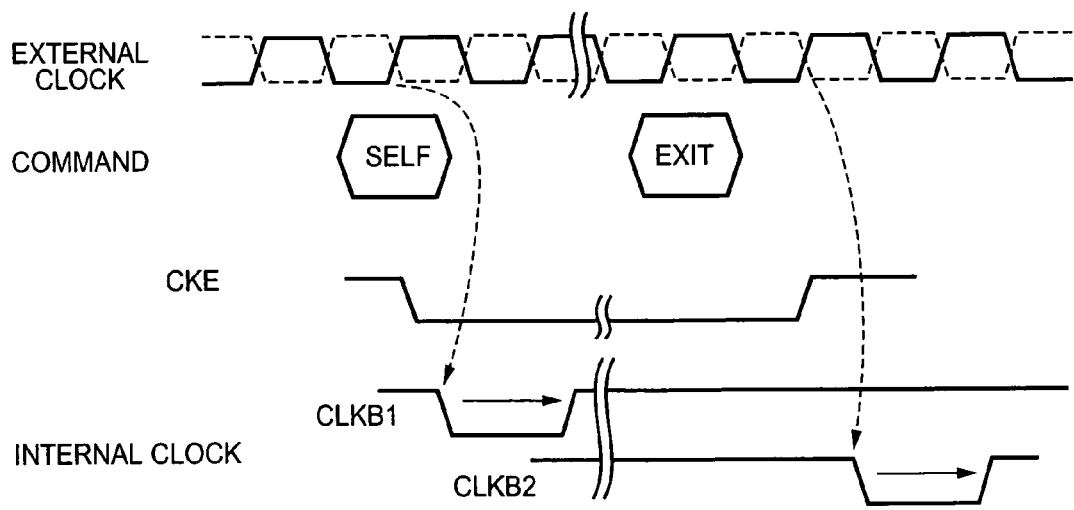
FIG. 8 is a time chart for describing an operation of the read command latch circuit illustrated in FIG. 6 in a self-refresh mode as a second embodiment of this invention.

As illustrated in FIG. 8, when the self-refresh command SELF is latched by the external clock signal CK, a clock enable signal CKE is turned inactive so that the input of the external clock signal is stopped.

The internal clock signal CLKB1 as one-shot pulses turns to a high level and is automatically reset. The internal clock signal CLKB2 is not produced because the external clock signal is stopped.

When the self-refresh mode returns to a normal operation mode, the clock enable signal CKE is activated by a self-refresh exit command EXIT so that the external clock signal CK is inputted. Then, the internal clock signals are generated.

In this embodiment, the internal clock generating circuit uses the one-shot pulses in order to satisfy the above-mentioned specifications. Specifically, the falling edges of the internal clock signal CLKB1 are generated by the rising edges of the external clock signal CK and the rising edges of the internal clock signal CLKB1 spontaneously occur as one-shot pulses. On the other hand, the internal clock signal CLKB2 is not produced because the external clock signal CK is stopped. Therefore, in this embodiment, a state where the internal clock signals are not reset never occurs upon the self-refresh operation of the SDRAM. Thus, an operation error will not possibly be caused.

In the first and the second embodiments, the internal clock frequency for the command latch circuit responsive to the command signal as an external command signal is lowered to ½ of the external clock frequency. It is therefore possible to increase the pulse width of the internal clock signal and to enlarge the latch margin upon a high-frequency operation. Thus, since the operating frequency of the latch circuit can be lowered to ½, it is possible to reserve an operating margin at an internal node inside the latch circuit and to improve the setup and the hold characteristics affected by the operating margin.

Third Embodiment

Next referring to FIGS. 9 and 10, a DDR-SDRAM will be described as a third embodiment.

Figure 9:
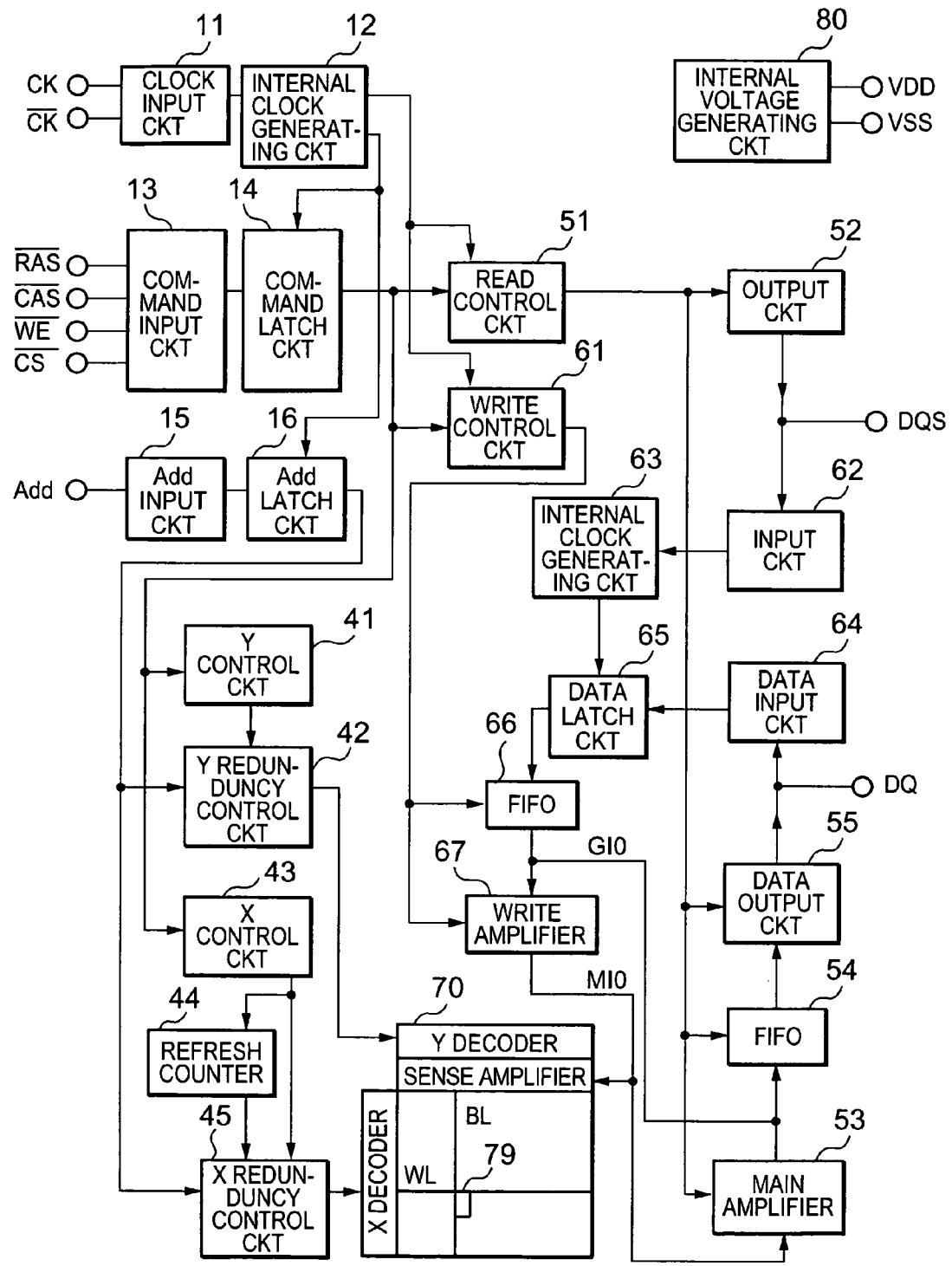
FIG. 9 is a view showing, as a third embodiment of this invention, a DDR-SDRAM as a synchronous memory including the latch circuit.

Referring to FIG. 9, external clock signals CK and $\overline{CK}$ are supplied through a clock input circuit 11 to an internal clock generating circuit 12.

Supplied with the external clock signals CK and $\overline{CK}$, the internal clock generating circuit 12 produces two one-shot pulses as internal clock signals CLKB1 and CLKB2. By timings of the internal clock signals CLKB1 and CLKB2, an address signal, a command signal, and other various internal control signals are controlled.

A command input circuit 13 is supplied with control input signals including a row address strobe signal $\overline{RAS}$, a column address strobe signal $\overline{CAS}$, a write enable signal $\overline{WE}$, and a chip selection signal $\overline{CS}$ in synchronization with the external clock signals CK and $\overline{CK}$ and delivers the control input signals to a command latch circuit 14. The command1 latch circuit 14 is supplied with the two internal clock signals CLKB1 and CLKB2 from the internal clock generating circuit 12 and latches the control input signals.

An address (Add) input circuit 15 having an address buffer function is supplied with an X address signal and a Y address signal through a common input terminal address and time-sequentially delivers the X address signal and the Y address signal to an address (Add) latch circuit 16 in synchronization with the external clocks CK and $\overline{CK}$. The X address signal and the Y address signal supplied through the Add input circuit 15 are captured by the Add latch circuit 16.

The X address signal captured by the Add latch circuit 16 is supplied to an X redundancy control circuit 45 having a predecoder function. The X redundancy control circuit 45 produces an output signal supplied to an X decoder 73 (FIG. 10) of the memory block 70 to produce a selection signal for a word line WL. By a selecting operation of the word line WL, a small read signal appears on a complementary bit line BL of a memory array 71 and amplified by the sense amplifier.

On the other hand, the Y address signal captured by the Add latch circuit 16 is supplied to a Y redundancy control circuit 42 having a predecoder function. The Y redundancy control circuit 42 produces an output signal supplied to a Y decoder 72 of the memory block 70 to produce a selection signal for a bit line BL.

Next, peripheral circuits of the memory block 70 will be described.

Supplied with various signals from the command latch circuit 14, the Y control circuit 41 accesses through the Y redundancy control circuit 42 to the Y decoder 72 of the memory block 70. Specifically, the address signal captured in a column address buffer of the Y redundancy control circuit 42 is supplied as a preset data to a column address counter included in the Y control circuit 41. In accordance with an operation mode designated by a command signal (which will later be described), the column address counter delivers to the Y decoder 72 a column address signal as the preset data or a value obtained by successively incrementing the column address signal.

Supplied with various command signals from the command latch circuit 14, the X control circuit 43 accesses through the X redundancy control circuit 45 to the X decoder 73 of the memory block 70.

In the refresh mode, a row address buffer in the X redundancy control circuit 45 captures as a row address signal a refresh address signal produced by a refresh counter 44 for refresh control. In this embodiment, the refresh address signal is captured as the row address signal through the internal clock generating circuit 12, although not being limited thereto.

Each of the Y redundancy control circuit 42 and the X redundancy control circuit 45 memorizes a defective address and compares the memorized defective address and the address signal captured as mentioned above. Upon coincidence therebetween, the Y redundancy control circuit 42 or the X redundancy control circuit 45 request the Y decoder 72 or the X decoder 73 to select a spare word line WL or a spare bit line BL and inhibit a selecting operation for a normal word line WL or a normal bit line BL.

A read control circuit 51 and a write control circuit 61 are supplied with external control signals (such as a clock signal, a clock enable signal, a chip select signal, a column address strobe signal, a row address strobe signal, a write enable signal, and a data input/output mask control signal) from the command latch circuit 14 as well as an address signal corresponding to a memory bank, although not being limited thereto. With reference to level change or timings of these signals, the read control circuit 51 and the write control circuit 61 produce various control signals, such as a control signal for controlling an operation mode in the DDR-SDRAM, and various timing signals corresponding thereto. For this purpose, each of the read control circuit 51 and the write control circuit 61 has a control logic and a mode register.

Memorized information amplified by the sense amplifier in the memory block 70 and selected by a column switch circuit (not shown) is connected to a common input/output line MIO and transmitted to a main amplifier 53. The main amplifier 53 is implemented as a main amplifier 74 in the memory block 70 (FIG. 10), together with a write amplifier 67 of a write circuit. Specifically, in case of a read operation, a read data signal read through a Y switch circuit is amplified and outputted from an external terminal DQ through a data output circuit 55 as an output buffer. On the other hand, in case of a write operation, a write data signal supplied from the external terminal DQ is captured through a data input circuit 64 as an input buffer and transmitted through the write circuit to the common input/output line MIO and a selected bit line BL. The write data signal is transmitted to the selected bit line BL by an amplifying operation of the sense amplifier and a capacitor of the memory cell 79 holds electric charges corresponding to the write data signal.

Supplied with an operating voltage, such as a voltage VDD and a voltage VSS from power supply terminals, an internal power generating circuit 80 generates a precharge voltage VDD/2, a plate voltage VDD/2, an internal step-up voltage VPP, an internal step-down voltage VDL, and a substrate back bias voltage VBB.

Figure 10:
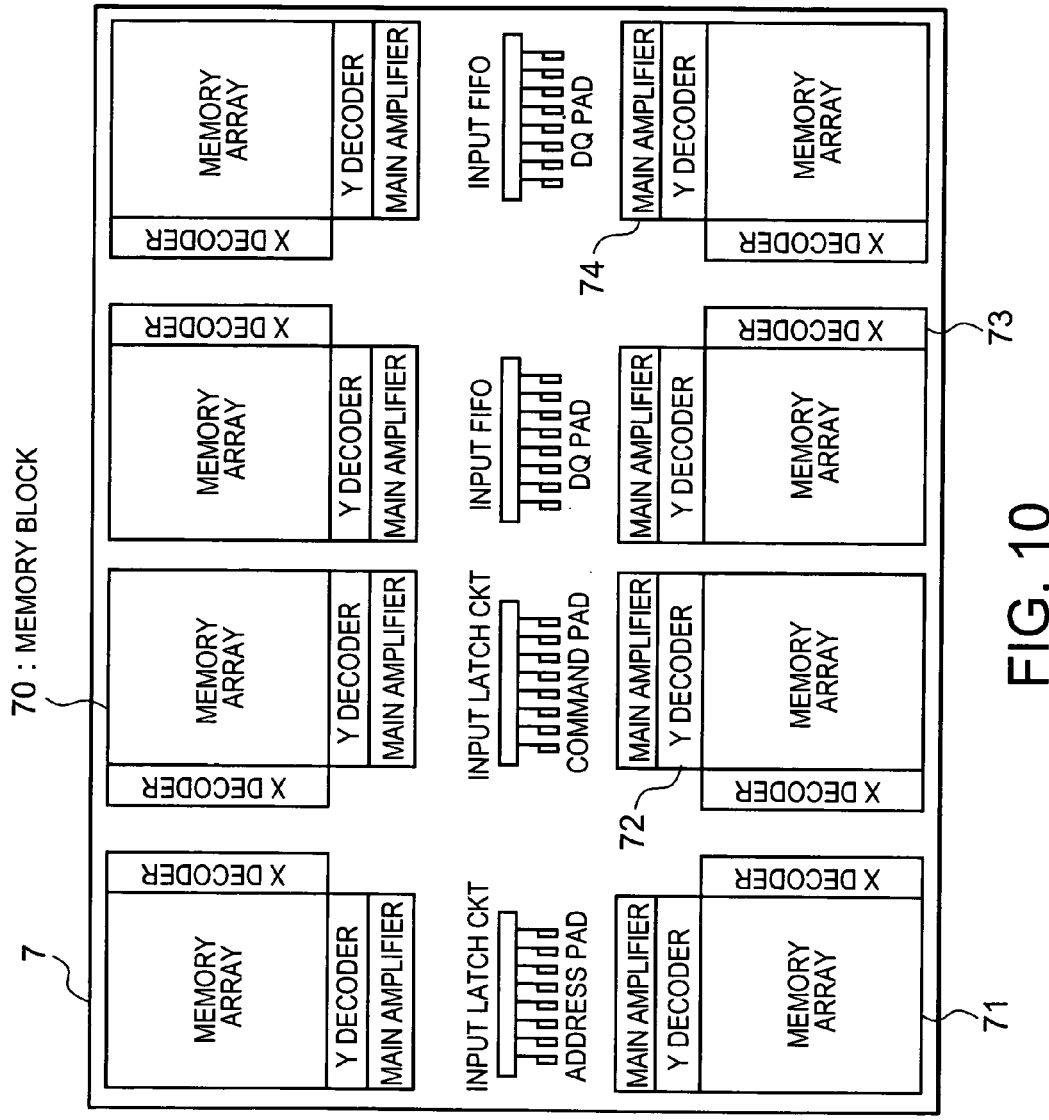
FIG. 10 is a view showing a memory chip layout of the DDR-SDRAM with eight memory blocks.

Referring to FIG. 10, description will be made of a DDR-SDRAM chip 7 including a plurality of memory blocks 70.

As illustrated in FIG. 10, the memory chip 7 comprises eight memory blocks 70. Thus, in the SDRAM in this embodiment, the memory chip 7 comprises a plurality of memory blocks or banks. Each of the memory blocks 70 comprises a memory array 71, a Y decoder 72, an X decoder 73, and a main amplifier 74. The X decoder 73 is arranged along one side of the memory array 71. The Y decoder 72 and the main amplifier 74 are arranged near the center of the memory chip 7 to be perpendicular to the X decoder 73.

A memory bank is formed by each pair of two memory blocks 70 whose X decoders 73 are adjacent to each other. In a transversal direction of the memory chip 7 (i.e., in a horizontal direction in the figure), two memory banks are arranged in parallel so that the four memory blocks 70 are aligned in a single row. Peripheral circuits are arranged at the center of the memory chip 7 along the transversal direction of the memory chip 7. In a direction perpendicular to the transversal direction (i.e., in a vertical direction in the figure), upper two memory banks and lower two memory banks are arranged symmetrically with respect to the peripheral circuits so that the Y decoders 72 and the main amplifiers 74 of the upper two memory banks are faced to those of the lower two memory banks. Thus, the eight memory blocks 70 forms the single memory chip 7.

Referring again to FIG. 9 in addition to FIG. 10, the memory array 71 of each memory block 70 has a plurality of sub-arrays separated along the word line WL extending from the X decoder 72 in the horizontal direction in the figure and a main-word-line extending through the sub-arrays and connected to a plurality of sub-word-lines in the sub-arrays. The sub-word-lines are selected by a sub-word-line selecting line. Thus, a hierarchical word-line system is adopted. With this structure, the number of memory cells 79 connected to each single sub-word-line is reduced so that an operation of selecting the sub-word-lines is carried out at a high speed.

Further, the memory array 71 of each memory block 70 has a plurality of sub-arrays separated along a Y selecting line extending from the Y decoder 72. The bit line BL is divided by these sub-arrays. Therefore, the number of memory cells 79 connected to the bit line BL is reduced so that a read data voltage read from the memory cells 79 to the bit line BL can be assured. The memory cell 79 comprises a dynamic memory cell in which presence and absence of electric charges in a memory capacitor correspond to data "1" and data "0", respectively. The read operation is carried out by charge coupling between the electric charges in the memory capacitor and precharged electric charges on the bit line BL. Therefore, by reducing the number of the memory cells 79 connected to the bit line BL, a required signal amount can be assured.

Although not shown in the figure, sub-word driver arrays are arranged on left and right sides of each sub-array. On upper and lower sides (in a direction of the bit line), sense amplifier arrays are arranged. Each of the sense amplifier arrays is provided with a column selecting circuit and a bit line precharge circuit. By selecting the word line (sub-word-line), a data is read out from the memory cell. At this time, a small potential difference appearing on each bit line is detected and amplified by the sense amplifier.

Although not specifically limited, the main input/output line MIO extends above the sub-word driver arrays in the vertical direction in FIG. 10. Along the sense amplifier array, a local input/output line LIO is arranged. By a row selecting signal, the local input/output line LIO and the main input/output line MIO are connected. The peripheral circuits are connected to a global input/output line GIO which is connected to the main input/output line MIO corresponding to the selected memory bank. The global input/output line GIO is connected to a pad DQ-PAD connected to the external terminal DQ through an input/output FIFO (first-in-first-out) circuit and input and output circuits as input and output buffers.

Although not shown in FIG. 10, the memory chip 7 is provided with appropriate peripheral circuits. The address signal supplied from the Add input circuit 15 (FIG. 9) is captured by the Add latch circuit 16 in synchronization with the external clock signals CK and $\overline{CK}$. Thereafter, in response to a command signal, the address signal is captured by a circuit of the row address buffer and the column address buffer in an address multiplex fashion. The address signal thus supplied is held by each address buffer. For example, each of the row address buffer and the column address buffer holds the address signal captured over a single memory cycle period. Each of the Y redundancy control circuit 42 and the X redundancy control circuit 45 having a transistor (MOSFET) or the like for comparing a memorized address memorized in a fuse and an input address is also formed at the center of the memory chip 7.

In the DDR-SDRAM in this embodiment, in the two memory arrays 71 forming one memory bank, eight memory arrays for four banks whose addresses are identified by addresses on the main input/output line MIO by "0" and "1" for Y0 and Y1. Specifically, an address "0" corresponds to Y0=0 and Y1=0, an address "1" to Y0=1 and Y1=0, an address "2" to Y0=0 and Y1=1, and an address "3" to Y0=1 and Y1=1.

In this state, in the read operation, 32 bits are selected from the two memory arrays, 16 bits from each memory array, in correspondence to the column address signal. By the use of the global input/output line GIO, a 32-bit data is outputted. Thus, the 4N-prefetch operation (N=8) is carried out. Specifically, the output circuit produces 8 bits of the address "0" in synchronization with a first rising edge of the clock signal CK, 8 bits in synchronization with a first falling edge of the clock signal CK, 8 bits in synchronization with a second rising edge of the clock signal CK, and 8 bits in synchronization with a second falling edge of the clock signal CK, i.e., 8 bits at each of four time instants.

Although not specifically limited, the memory chip of the DDR-SDRAM having a large memory capacity such as 256 megabits is divided into eight memory blocks and two adjacent ones of the memory blocks form one bank as described above. Each memory block is divided into 8×16 arrays as submats. Each single submat has 512×512 bits. Thus, 512 memory cells 79 are connected to a single sub-word-line. Similarly, 512 memory cells 79 are connected to the bit line BL. In the following description, the main input/output line MIO will briefly be called a MIO line and the global input/output line GIO will briefly be called a GIO line.

Each of a main amplifier circuit, a main amplifier output circuit, the GIO line, and an output register circuit is assigned to each of the addresses "0", "1", "2", and "3". As described above, data transfer from the main amplifier 74 to the output register is simultaneously carried out for the addresses "0", "1", "2", and "3". Specifically, the 32-bit data read on the MIO line is simultaneously detected by the main amplifiers 74 and transferred to the output registers. Depending upon start addresses Y0 and Y1, the data in the output registers are outputted in synchronization with the rising and the falling edges of the external clock CK. Therefore, in this embodiment, 32 main amplifiers 74 and 32 GIO lines are simultaneously operated.

Fourth Embodiment

Figure 11:
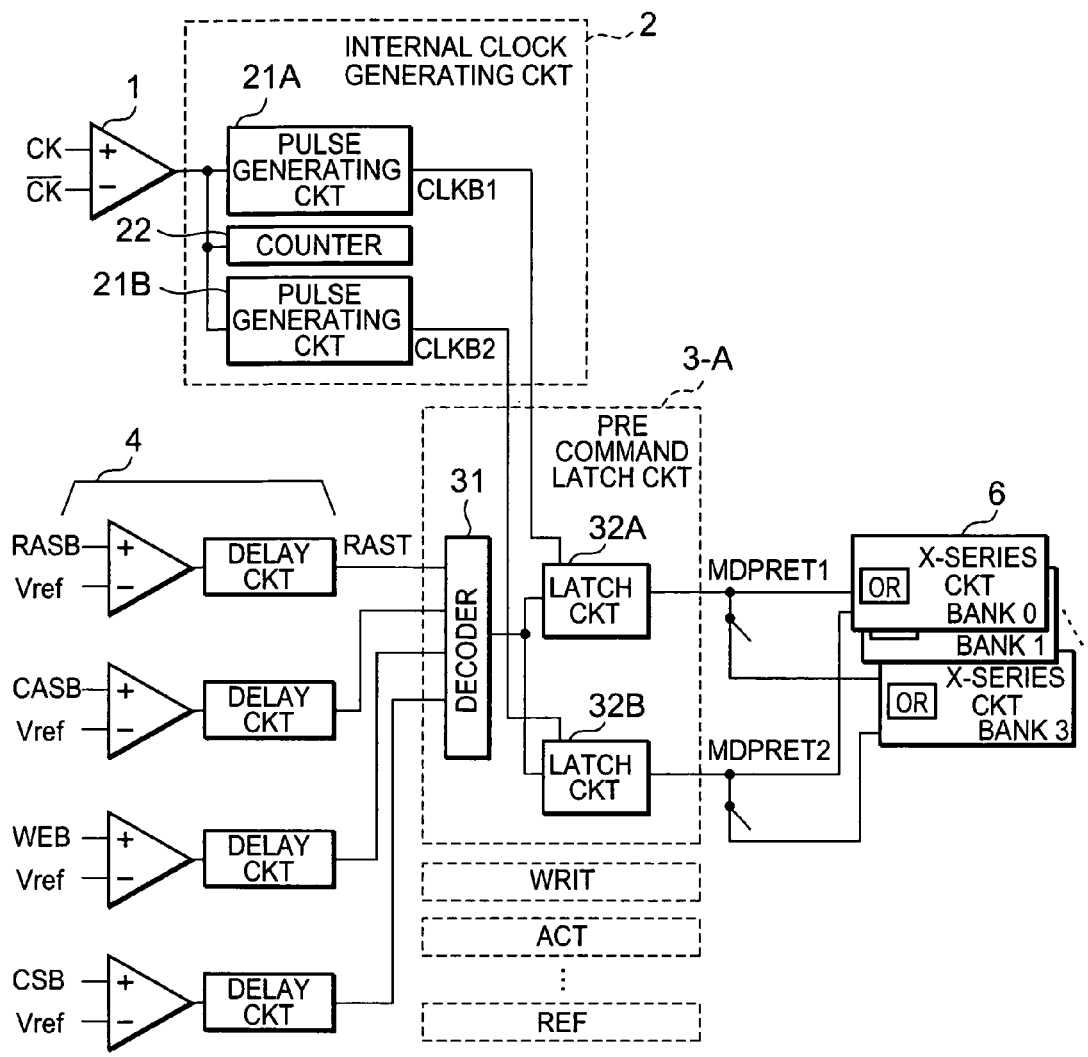
FIG. 11 is a functional block diagram of a synchronous memory having a precharge command latch circuit according to a fourth embodiment of this invention.
Figure 12:
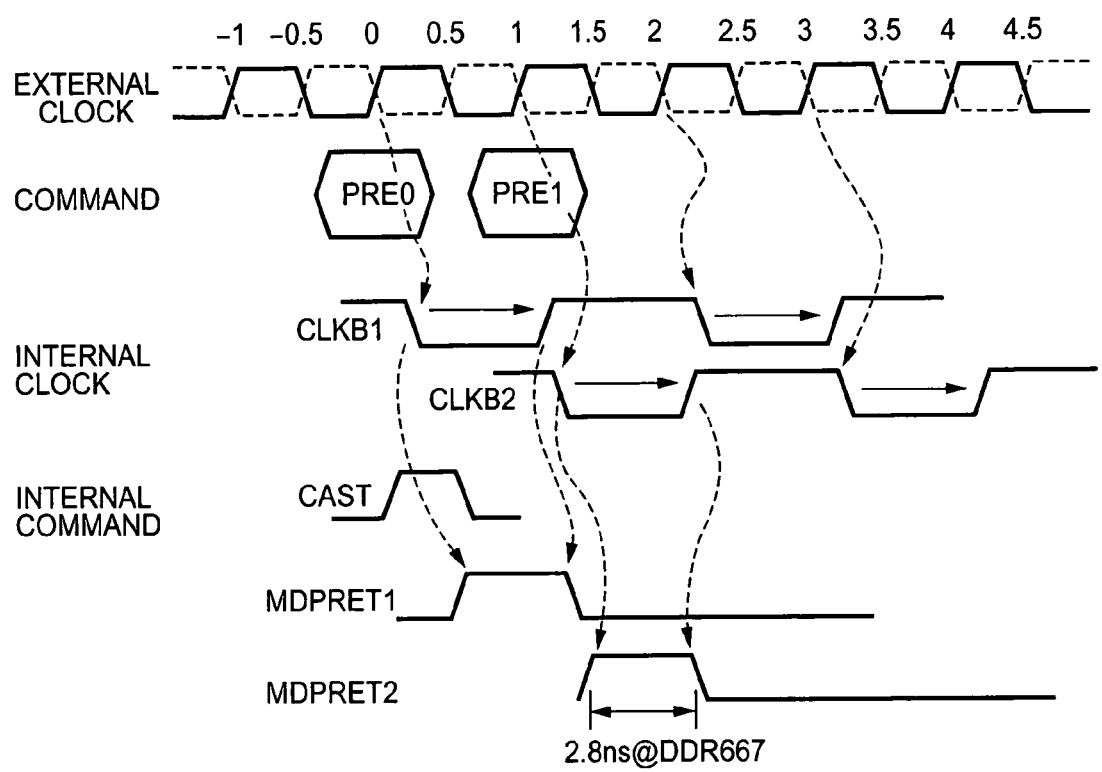
FIG. 12 is a time chart for describing an operation of the precharge command latch circuit illustrated in FIG. 11.

Referring to FIGS. 11 and 12, a synchronous memory having a precharge (PRE) command latch circuit will be described as a fourth embodiment. The fourth embodiment is basically similar in structure to the first embodiment except that the read command latch circuit 3 is replaced by the PRE command latch circuit 3-A. Specifically, the command latch circuit 3-A does not have an output circuit for selecting one of outputs of the two latch circuits. One of the two outputs of the command latch circuit 3-A is selected by the memory bank. Similar parts are designated by like reference numerals and will not be described any longer.

Referring to FIG. 11, the synchronous memory comprises the external clock input circuit 1, the internal clock generating circuit 2, the PRE command latch circuit 3-A, the external signal input circuit 4, and an X-series circuit 6.

Specifically, the PRE command latch circuit 3-A comprises the latch circuits 32A and 32B and produces two output signals MDPRET1 and MDPRET2. In the DDR2-SDRAM, an interval between the same commands is one clock only in case of precharge commands. Therefore, if the structure in FIG. 4 is directly applied to the PRE command latch circuit, an operation error may be caused to occur upon inputting consecutive commands. Therefore, utilizing the fact that the command interval of the precharge commands for the same memory bank is two clocks or more, the latch circuits 32A and 32B deliver the output signals MDPRET1 and MDPRET2 to the X-series circuit 6 in each memory bank. The X-series circuit 6 in each memory bank has a structure with an OR logic at an input portion of a precharge control circuit.

Referring to FIG. 12, it is assumed that precharge commands PRE0 and PRE1 for the memory banks 0 and 1 are consecutively inputted at the rising edges 0 and 1 of the external clock signal, respectively. In this state, the output signals MDPRET1 and MDPRET2 of the latch circuits 32A and 32B are consecutively and independently outputted. However, the precharge commands for the same memory bank are not continuously inputted. Therefore, the precharge circuit in the memory bank 0 is operated by the signal MDPRET1 while the precharge circuit in the memory bank 1 is operated by the signal MDPRET2.

Thus, by the use of the structure in FIG. 11, the PRE command latch circuit 3-A exhibits the effect similar to that of the first embodiment.

Fifth Embodiment

Next referring to FIGS. 13 to 15, a synchronous memory having an address latch circuit will be described as a fifth embodiment. The fifth embodiment is basically similar in structure to the first and the fourth embodiments in FIG. 4 and FIG. 11 except that the read command latch circuit 3 or the precharge command latch circuit 3-A is replaced by an address latch circuit 3-B and that the external signal input circuit 4 is replaced by an address signal input circuit 4-B. Specifically, the address latch circuit 3-B receives each address and has no decoder. One address selected from the outputs of the latch circuits is delivered to the memory bank in the X-series circuit or the Y-series circuit. Similar parts are designated by like reference numerals and description thereof will be omitted.

Figure 13:
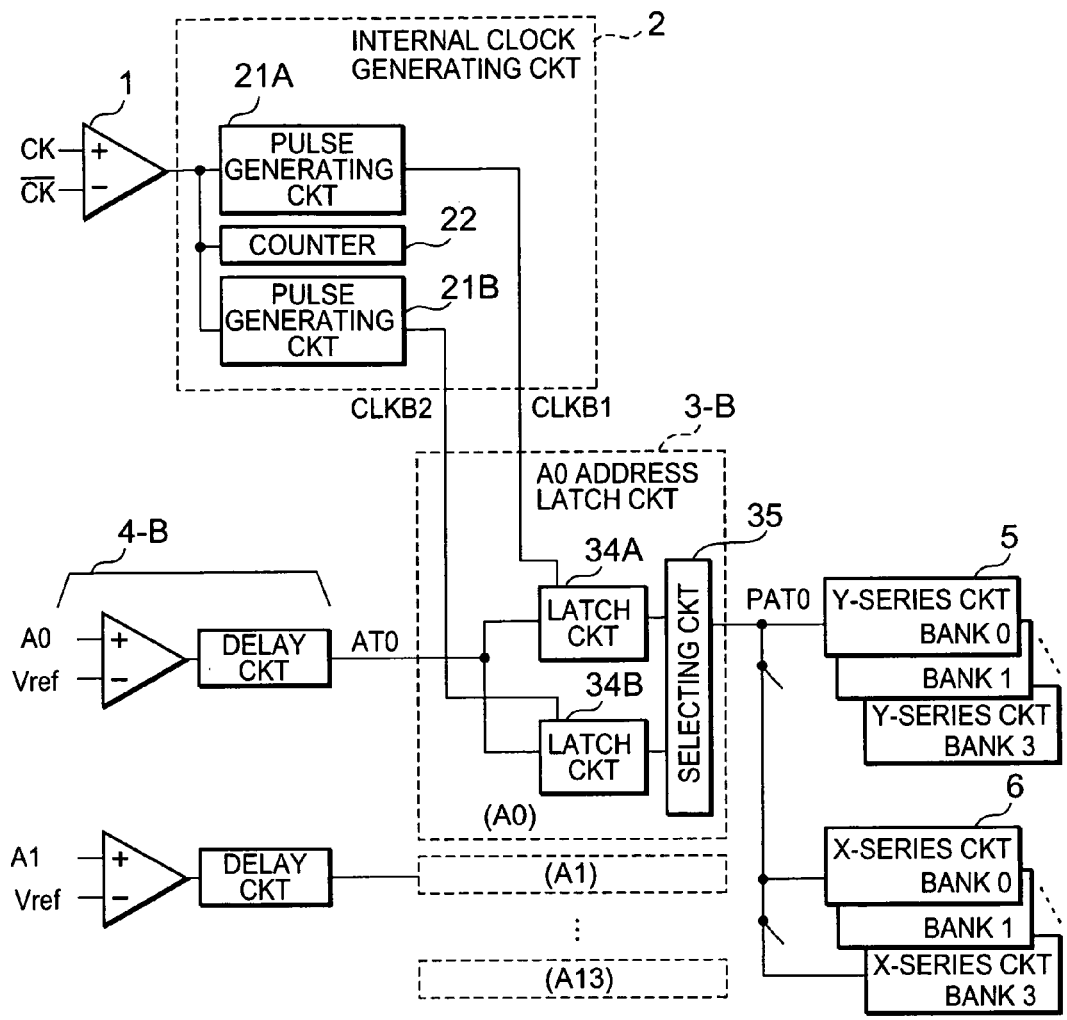
FIG. 13 is a functional block diagram of a synchronous memory having an address latch circuit according to a fifth embodiment of this invention.

Referring to FIG. 13, an address latch system in this embodiment comprises the external clock input circuit 1, the internal clock generating circuit 2, the A0 address latch circuit 3-B and the A0 address signal input circuit 4-B corresponding to the address A0, and the Y-series circuit 5 and the X-series circuit 6 corresponding to the memory block. The address latch circuit 3-B and the address signal input circuit 4-B correspond to the Add latch circuit 16 and the Add input circuit 15 in FIG. 9, respectively.

In an address latch system, the address signal is inputted in synchronization with the rising edge of the external clock signal in every clock cycle, unlike the command signal. Therefore, the circuit structure in FIG. 4 or 11 is not directly applied. The A0 address latch circuit 3-B comprises an address latch circuit 34 having the latch circuits 34A and 34B and an output circuit formed by an address selecting circuit 35.

Figure 14:
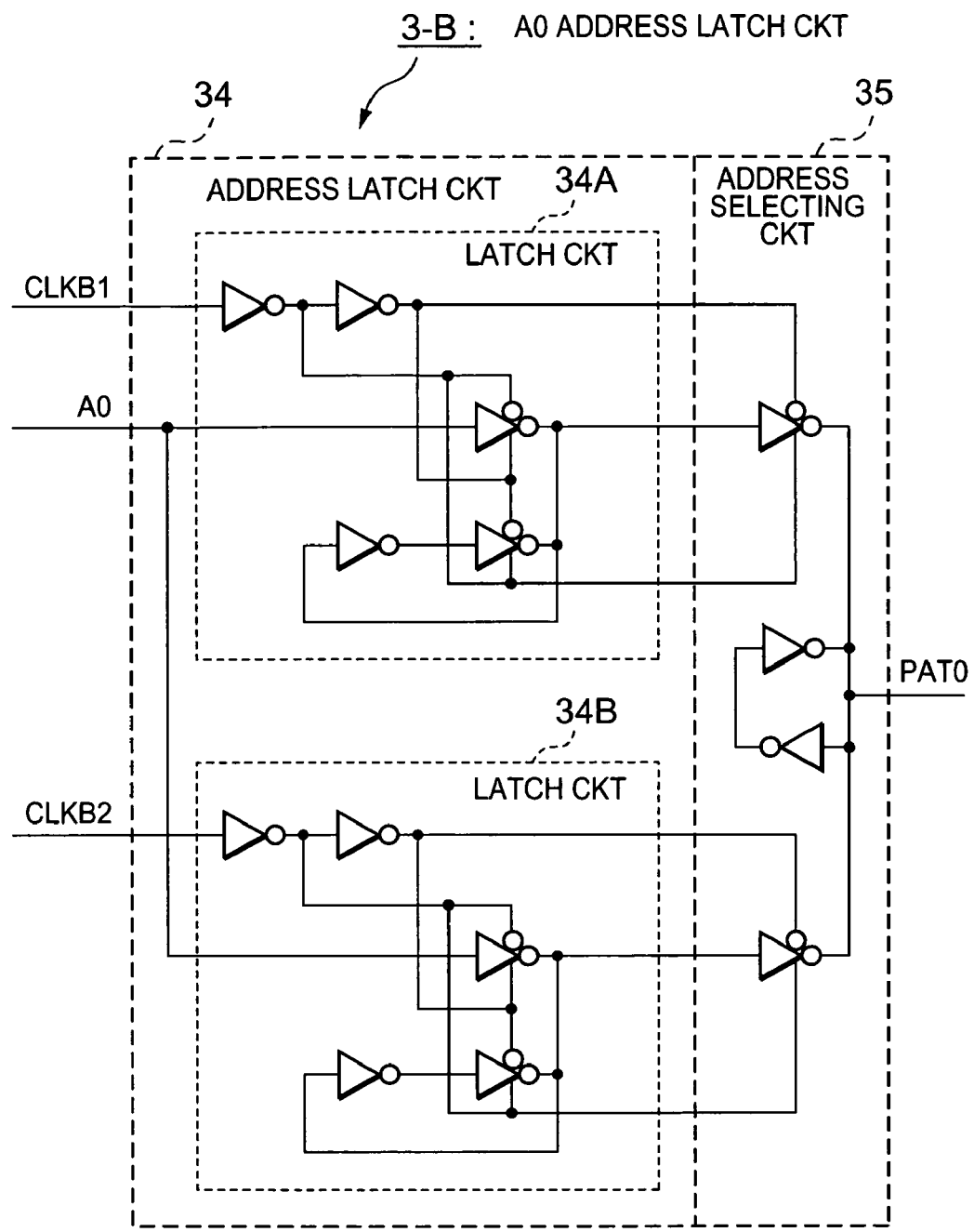
FIG. 14 is a circuit block diagram of the address latch circuit illustrated in FIG. 13.

Referring to FIG. 14, the A0 address latch circuit 3-B will be described. For each of the remaining addresses, the similar address latch circuit is provided.

Supplied with the internal clock signals CLKB1 and CLKB2, the latch circuits 34A and 34B latch the address AT0. The address selecting circuit 35 delivers, as an output signal PAT0, the address latched by one of the latch circuits 34A and 34B by a corresponding internal clock signal, to the peripheral circuits of the memory bank.

The output of the above-mentioned command latch circuit is produced by the one-shot pulse using a high enable signal for every command after the external command signal is decoded. Therefore, every time after outputting the command, the output of the command latch circuit must be reset in order to wait a next input. On the other hand, the output of the address latch circuit 34 need not be reset every time.

This is because the number of address signals is as many as 14 for 1 gigabit and a decoded signal after decoding can not be run within the chip. Therefore, an undecoded signal before decoding is directly latched and delivered. Therefore, the address signal is a significant signal at both of high and low levels and need not be reset.

Figure 15:
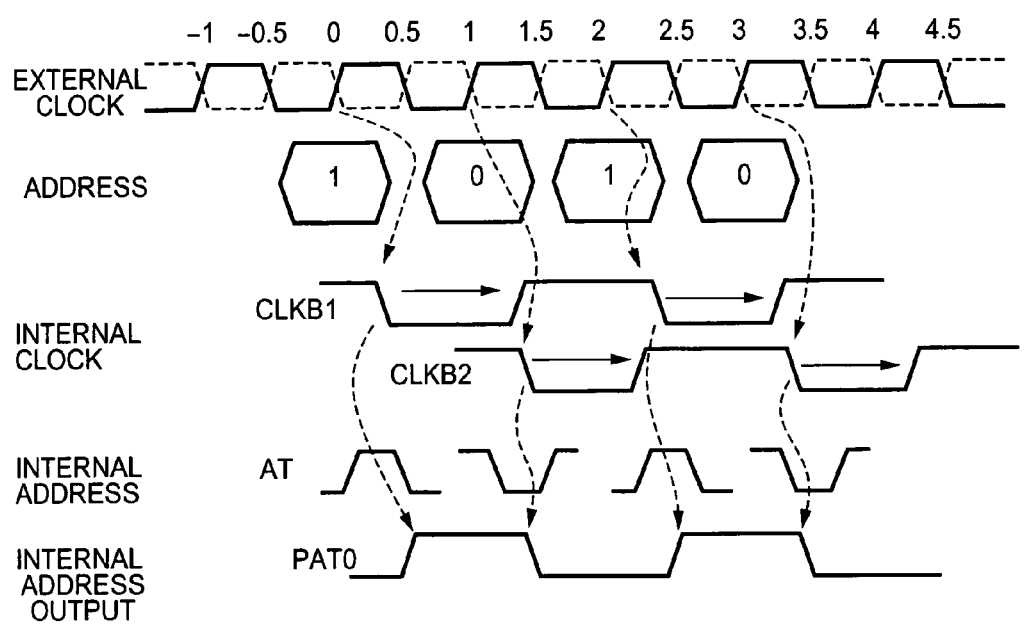
FIG. 15 is a time chart for describing an operation of the address latch circuit illustrated in FIG. 13.

Referring to FIG. 15, it is assumed that external addresses 1 and 0 are successively inputted at the rising edges 0, 1, 2, and 3 of the external clock signal. In this state, the address "1" inputted at each of the rising edges 0 and 2 of the external clock signal is latched by the internal clock signal CLKB1 and delivered as the address output signal PAT0 to the X- or the Y-series circuit. The address "0" inputted at each of the rising edges 1 and 3 of the external clock signal is latched by the internal clock signal CLKB2 and delivered as the address output signal PAT0 to the X- or the Y-series circuit.

Thus, by the structure of FIG. 13, the A0 address latch circuit exhibits the effect similar to that of the first embodiment.

The circuit structure illustrated in FIG. 14 may be replaced by a different circuit structure as far as the above-mentioned function is achieved.

In the latch system according to this invention, the internal clock generating circuit generates the two internal clock signals CLKB1 and CLKB2 in response to the external clock signal CK. The latch circuit for each of the command signal, the address signal, and the data signal is implemented by two latch circuits responsive to the internal clock signals so as to easily adapt to a double cycle period. The above-mentioned circuit is applicable to a synchronous apparatus having a latch circuit for a command signal, an address signal, and a data signal and requiring a high-frequency operation.

While this invention has thus far been described in conjunction with the preferred embodiments thereof, it will be readily possible for those skilled in the art to put this invention into practice in various other manners without departing from the scope of this invention.

What is claimed is:

1. A latch system for latching an external input signal supplied in synchronization with an external clock signal, the latch system comprising an internal clock generating circuit configured to generate two internal clock signals as one-shot pulses in synchronization with the external clock signal, and a pair of latch circuits configured to latch the external input signal by the two internal clock signals, wherein one of the internal clock signals is synchronized with a first rising edge of the external clock signal while the other internal clock signal is synchronized with a second rising edge of the external clock signal next following the first rising edge.

2. The latch system according to claim 1, wherein the internal clock signals have a frequency corresponding to ½ of that of the external clock signal.

3. The latch system according to claim 2, further comprising a decoder configured to decode a read command signal as the external input signal to produce a decoded read command signal and send the decoded read command signal to the latch circuits, and an output circuit supplied with latch output signals as one-shot pulses produced by the latch circuits to produce an output signal which is sent to a predetermined peripheral circuit of a memory block.

4. The latch system according to claim 2, further comprising a decoder configured to decode a refresh command signal as the external input signal to produce a decoded refresh command signal and send the decoded refresh command signal to the latch circuits, and an output circuit supplied with latch output signals as one-shot pulses produced by the latch circuits to produce an output signal which is sent to a predetermined peripheral circuit of a memory block.

5. The latch system according to claim 2, further comprising a decoder configured to decode a precharge command signal as the external input signal to produce a decoded precharge command signal and send the decoded precharge command signal to the latch circuits, a predetermined peripheral circuit of a memory block having an OR circuit for selecting latch output signals as one-shot pulses produced by the latch circuits.

6. The latch system according to claim 2, wherein the latch circuits are supplied with an address signal and produce latch output signals as one-shot pulses, the latch system further comprising a selecting circuit configured to select the latch output signals produced by the latch circuits to produce a selected output signal which is sent to a predetermined peripheral circuit of a memory block.

7. A synchronous memory comprising the latch system claimed in claim 2.

8. A synchronous memory comprising the latch system claimed in claim 1.

9. A synchronous memory comprising the latch system claimed in claim 3.

10. A synchronous memory comprising the latch system claimed in claim 4.

11. A synchronous memory comprising the latch system claimed in claim 5.

12. A synchronous memory comprising the latch system claimed in claim 6.

13. A latch system for latching an external command signal supplied in synchronization with an external clock signal, the latch system comprising:

means for generating two internal clock signals as one-shot pulses in synchronization with the external clock signal; and means for latching the external command signal by the two internal clock signals, respectively, and successively outputting the command signal to an output circuit in correspondence to the internal clock signals, said means for latching including two latch circuits, wherein one of the internal clock signals is synchronized with a first rising edge of the external clock signal while the other internal clock signal is synchronized with a second rising edge of the external clock signal next following the first rising edge.

14. The latch system according to claim 13, wherein the internal clock signals have a frequency corresponding to ½ of that of the external clock signal.

15. The latch system according to claim 14, further comprising:

means for decoding a read command signal as the external input signal to produce a decoded read command signal and sending the decoded read command signal to the latch circuits; and output means for producing an output signal which is sent to a predetermined peripheral circuit of a memory block, said output means being supplied with latch output signals as one-shot pulses produced by the latch circuits.

16. The latch system according to claim 14, further comprising: a means for decoding a refresh command signal as the external input signal to produce a decoded refresh command signal and sending the decoded refresh command signal to the latch circuits; and output means for producing an output signal which is sent to a predetermined peripheral circuit of a memory block, said output means being supplied with latch output signals as one-shot pulses produced by the latch circuits.

17. The latch system according to claim 14, further comprising means for decoding a precharge command signal as the external input signal to produce a decoded precharge command signal and sending the decoded precharge command signal to the latch circuits, a predetermined peripheral circuit of a memory block having an OR circuit for selecting latch output signals as one-shot pulses produced by the latch circuits.

18. The latch system according to claim 14, wherein the latch circuits are supplied with an address signal and produce latch output signals as one-shot pulses, the latch system further comprising means for selecting the latch output signals produced by the latch circuits to produce a selected output signal which is sent to a predetermined peripheral circuit of a memory block.

* * * * *